United States Patent [19]
Kikuchi

[11] Patent Number: 5,977,806
[45] Date of Patent: Nov. 2, 1999

[54] PLL CIRCUIT WITH REDUCED RESPONSE VARIANCE DUE TO MANUFACTURING VARIATIONS

[75] Inventor: Hidekazu Kikuchi, Kanagawa, Japan

[73] Assignee: Sony Corporation, Japan

[21] Appl. No.: 08/826,124

[22] Filed: Mar. 27, 1997

[30] Foreign Application Priority Data

Apr. 22, 1996 [JP] Japan ................................. 8-099701

[51] Int. Cl.[6] ....................................................... H03L 7/06
[52] U.S. Cl. ............................................... 327/157; 331/2
[58] Field of Search ..................................... 327/141, 146, 327/147, 148, 150, 155, 156, 157, 159; 331/17, 2; 375/373, 375, 376

[56] References Cited

U.S. PATENT DOCUMENTS

| | | | |
|---|---|---|---|
| 5,144,254 | 9/1992 | Wilke | 327/156 |
| 5,422,604 | 6/1995 | Jokura | 331/2 |
| 5,566,204 | 10/1996 | Kardontchik et al. | 327/148 |
| 5,610,558 | 3/1997 | Mittel et al. | 331/2 |
| 5,657,359 | 8/1997 | Sakae et al. | 375/376 |

*Primary Examiner*—My-Trang Nu Ton
*Attorney, Agent, or Firm*—Rader, Fishman & Grauer; Ronald P. Kananen

[57] ABSTRACT

Variations in the response band of a PLL circuit due to manufacturing variations of the sensitivity of a voltage control oscillator are suppressed. With respect to an original PLL circuit which generates a clock signal having a predetermined frequency in accordance with an input signal, a dummy PLL circuit having a voltage control oscillator having characteristics substantially similar to those of a voltage control oscillator within the original PLL circuit is provided. By controlling the output current of a charge pump circuit within the original PLL circuit on the basis of a locked voltage of the voltage control oscillator within the dummy PLL circuit, the gain of the original PLL circuit is controlled.

6 Claims, 5 Drawing Sheets

PLL CIRCUIT WITH REDUCED RESPONSE VARIANCE DUE TO MANUFACTURING VARIATIONS

BACKGROUND OF THE INVENTION

1. Field of the Invention

The present invention relates to a PLL (Phase Locked Loop) circuit.

2. Description of the Related Art

A conventional PLL circuit, as shown in FIG. 6, is formed of a phase comparator 101, a charge pump circuit 102, a loop filter 103, a voltage control oscillator (VCO) 104, and a frequency divider 105. In such a PLL circuit constructed as described above, if the output current of the charge pump circuit 102 is denoted as Ip, the constants of the loop filter 103 as R and C, the sensitivity of the voltage control oscillator 104 as Ko, and the frequency-division ratio of the frequency divider 105 as N, the response of the phase of an output signal with respect to a phase change of an input signal is expressed by the following equation.

$$\frac{\text{output phase}}{\text{input phase}} = \frac{2\zeta\omega_n s + \omega_n^2}{s^2 + 2\zeta\omega_n s + \omega_n^2} \quad (1)$$

where $\omega_n$ is the natural angular frequency and $\zeta$ is the dumping coefficient, each of which is expressed as follows:

$$\omega_n = \sqrt{\frac{KoIp}{2\pi NC}}, \zeta = \sqrt{\frac{KoIpC}{8\pi N}} \cdot R \quad (2)$$

A -3db response band is expressed by the following equation.

$$\omega(-3\text{dB}) = \omega_n \sqrt{1 + 2\zeta^2 + \sqrt{1 + (1 + 2\zeta^2)^2}} \xrightarrow[\zeta \to \infty]{} 2\zeta\omega_n = \frac{KoIpR}{2\pi N} \quad (3)$$

That is, in a region where the dumping coefficient $\zeta$ is large, the response band is proportional to the product of the sensitivity Ko of the voltage control oscillator 104, the output current Ip of the charge pump circuit 102, and the constant R of the loop filter 103, i.e., loop gain.

Meanwhile, in a case in the whole PLL circuit is assembled into one semiconductor integrated circuit, all of the voltage control oscillator 104, resistors within the charge pump circuit 102, and resistors within the loop filter 103 have manufacturing variations controlled by a strong proportional correlation. Therefore, the output current Ip of the charge pump circuit 102 and the constant R of the charge pump circuit 102 tend to be inversely proportional, and their product is not susceptible to manufacturing variations. However, since the response band varies due to manufacturing variations in the sensitivity Ko of the voltage control oscillator 104, it is difficult to precisely control the response band of the PLL circuit.

SUMMARY OF THE INVENTION

The present invention has been achieved in view of the above-described problems. It is an object of the present invention to provide a PLL circuit which is capable of suppressing variations in a response band of a loop, which are caused by characteristic variations in a voltage control oscillator.

To achieve the above-described object, according to the present invention, there is provided a PLL circuit, comprising: a first PLL circuit which generates a clock signal having a predetermined frequency in accordance with an input signal; a second PLL circuit which has a voltage control oscillator having characteristics substantially similar to those of a voltage control oscillator within the first PLL circuit and which operates in accordance with a reference signal; and control means which controls the gain of the first PLL circuit on the basis of a locked voltage of the voltage control oscillator within the second PLL circuit.

In the PLL circuit having the above-described construction, there is a tendency for variations in the characteristics of the voltage control oscillator within the loop to be constant, and the respective characteristics of the voltage control oscillators of the first and second PLL circuits are substantially equal, and the locked voltage of the voltage control oscillator within the second PLL circuit becomes a measure for estimating the sensitivity of the voltage control oscillator within the first PLL circuit. Therefore, by controlling the gain of the first PLL circuit on the basis of the locked voltage of the voltage control oscillator within the second PLL circuit, it is possible to correct variations in the response band of a loop due to manufacturing variations in the sensitivity of the voltage control oscillator within the first PLL circuit. As a result, the response band of the first PLL circuit is stabilized.

The above and further objects, aspects and novel features of the invention will become more apparent from the following detailed description when read in connection with the accompanying drawings.

DESCRIPTION OF THE PREFERRED EMBODIMENTS

The preferred embodiments of the present invention will be described below with reference to the accompanying drawings.

Figure 1:
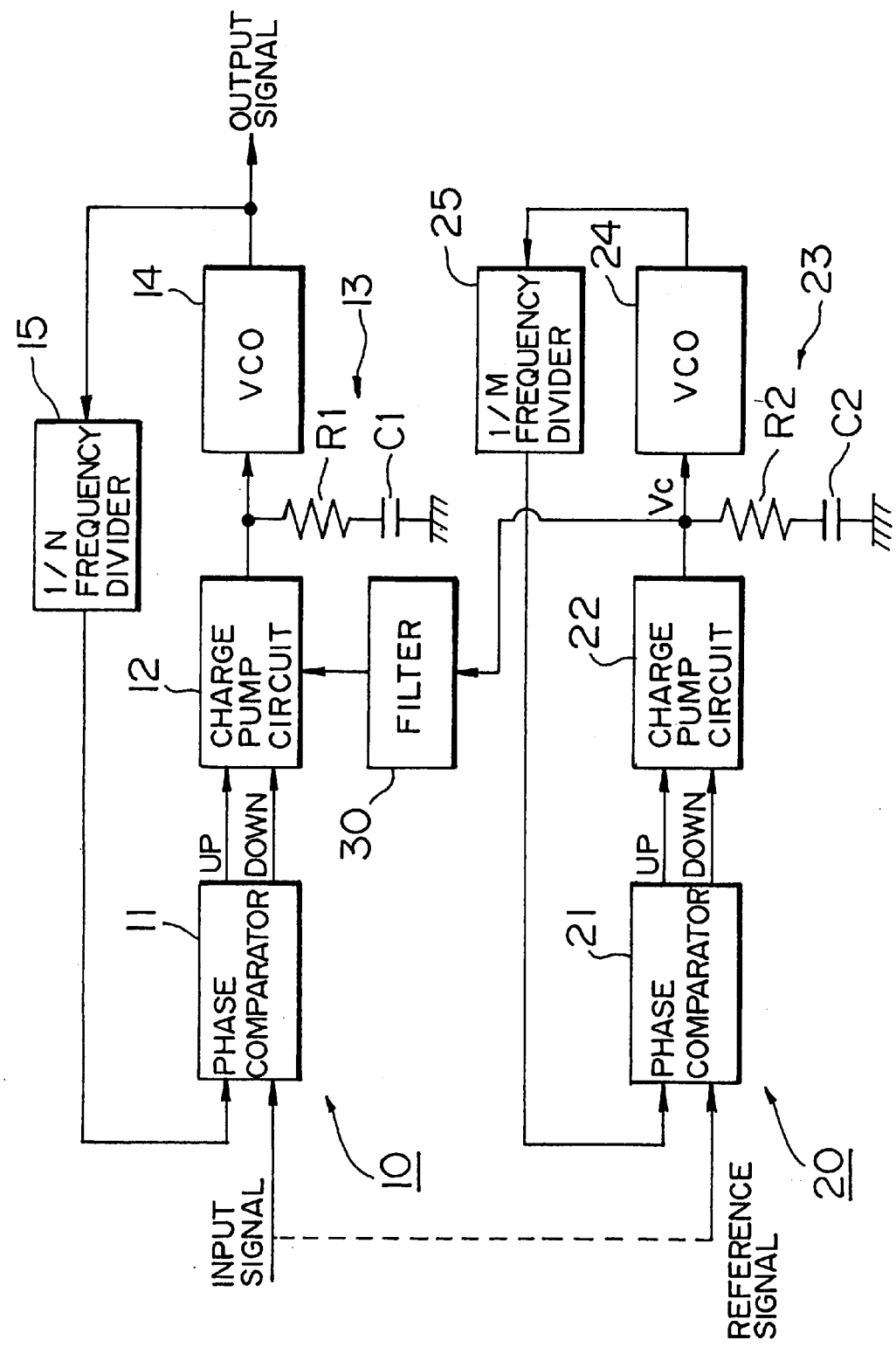
FIG. 1 is a block diagram illustrating a first embodiment of the present invention.

FIG. 1 is a block diagram illustrating a first embodiment of the present invention. In FIG. 1, a PLL circuit of this embodiment comprises a first PLL circuit 10 which generates a clock signal having a predetermined frequency in accordance with an input signal, and a second PLL circuit 20 which locks to a reference signal and which controls the gain of the first PLL circuit 10 on the basis of the locked voltage.

The first PLL circuit 10 comprises a phase comparator 11 which assumes an input signal supplied from an external source to be one input, a charge pump circuit 12 which outputs a current Ip which is pulse-width-modulated with phase information (up/down) from the phase comparator 11, a loop filter 13, formed of a resistor R1 and a capacitor C1, which smooths the output current Ip of the charge pump circuit 12, a voltage control oscillator 14 which assumes a DC output voltage of the loop filter 13 to be a control voltage and which outputs a clock signal having a frequency N times as high as that of the input signal, and a frequency divider 15 which frequency-divides an oscillation frequency of the voltage control oscillator 14 by 1/N and which assumes this divided frequency to be the other input.

Similar to the first PLL circuit 10, the second PLL circuit 20 basically comprises a phase comparator 21 which assumes a reference signal to be one input, a charge pump circuit 22 which outputs an output current Ip which is pulse-width-modulated with phase information from the phase comparator 21, a loop filter 23, formed of a resistor R2 and a capacitor C2, which smooths the output current Ip of the charge pump circuit 22, a voltage control oscillator 24 which assumes a DC output voltage of the loop filter 23 to be a control voltage and which outputs a clock signal having a frequency M times as high as that of the reference signal, and a frequency divider 25 which frequency-divides an oscillation frequency of the voltage control oscillator 24 by 1/M and which assumes this divided frequency to be the other input. As the voltage control oscillator 24, a voltage control oscillator is used having characteristics substantially similar to those of the voltage control oscillator 14 within the first PLL circuit 10.

Further, the DC output voltage of the loop filter 23 of the second PLL circuit 20, i.e., the control voltage Vc of the voltage control oscillator 24, is supplied to the charge pump circuit 12 of the first PLL circuit 10 via a filter 30 as a control input for controlling the output current Ip of the charge pump circuit 12. The filter 30 is provided to remove ripple noise contained in the control voltage Vc of the voltage control oscillator 24. Therefore, if this ripple noise is of a degree as to be ignorable in terms of circuit operation, the filter 30 may be omitted, and the control voltage Vc of the voltage control oscillator 24 may be directly supplied as a control input to the charge pump circuit 12.

Figure 2:
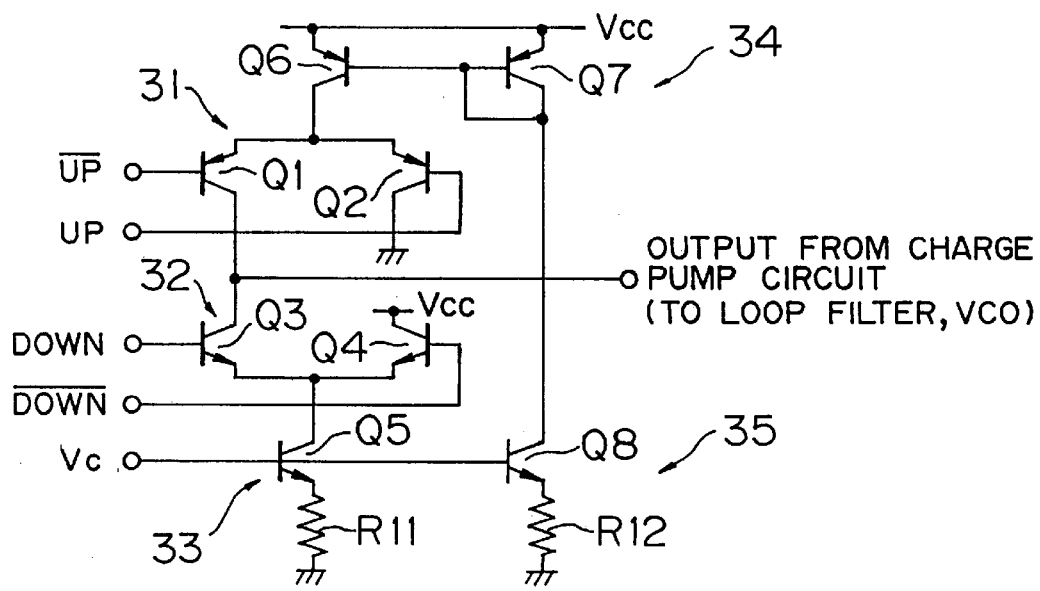
FIG. 2 is a circuit diagram illustrating an example of the circuitry of a charge pump circuit.

FIG. 2 shows an example of the circuitry of the charge pump circuit 12. In FIG. 2, pnp transistors Q1 and Q2 whose emitters are connected in common form a first differential circuit 31, and npn transistors Q3 and Q4 whose emitters are connected in common form a second differential circuit 32. Further, each collector of the transistors Q1 and Q3 is connected in common, forming a circuit output end, and a charge pump output is derived from the circuit output end and is supplied to the loop filter 13 and the voltage control oscillator 14 in FIG. 1. Each collector of the transistors Q2 and Q4 is grounded.

Between the bases of the transistors Q1 and Q2 of the first differential circuit 31, an up signal which causes the phase to lead is applied from the phase comparator 11 in FIG. 1. Between the bases of the transistors Q3 and Q4 of the second differential circuit 32, a down signal which causes the phase to lag is applied from the phase comparator 11. Between the emitter common connection point of the transistors Q3 and Q4 and a ground, a npn transistor Q5 and a resistor R11 are connected in series, forming a current source 33. A control voltage Vc is applied to the base of the transistor Q5 of the current source 33 from the loop filter 23 in FIG. 1 via the filter 30. Thereupon, the current source 33 controls electric current to be drawn from the second differential circuit 32 in response to the control voltage Vc.

Meanwhile, a pnp transistor Q6 is connected between an emitter common connection point of the transistors Q1 and Q2 of the first differential circuit 31 and a power source Vcc. This transistor Q6 forms a current mirror circuit 34 as a result of a common connection of the bases of the transistor Q6 and a pnp transistor Q7 whose base and collector are connected in common. Further, an npn transistor Q8 and a resistor R12 are connected in series between the collector of the transistor Q7 and a ground, forming a current source 35. Similar to the current source 33, a control voltage Vc is applied to the base of the transistor Q8 of the current source 35. Thereupon, the current source 35 controls electric current to be drawn into the first differential circuit 31 in response to the control voltage Vc.

Next, a description will be given of the operation of the PLL circuit of the first embodiment having the above-described construction.

Figure 3:
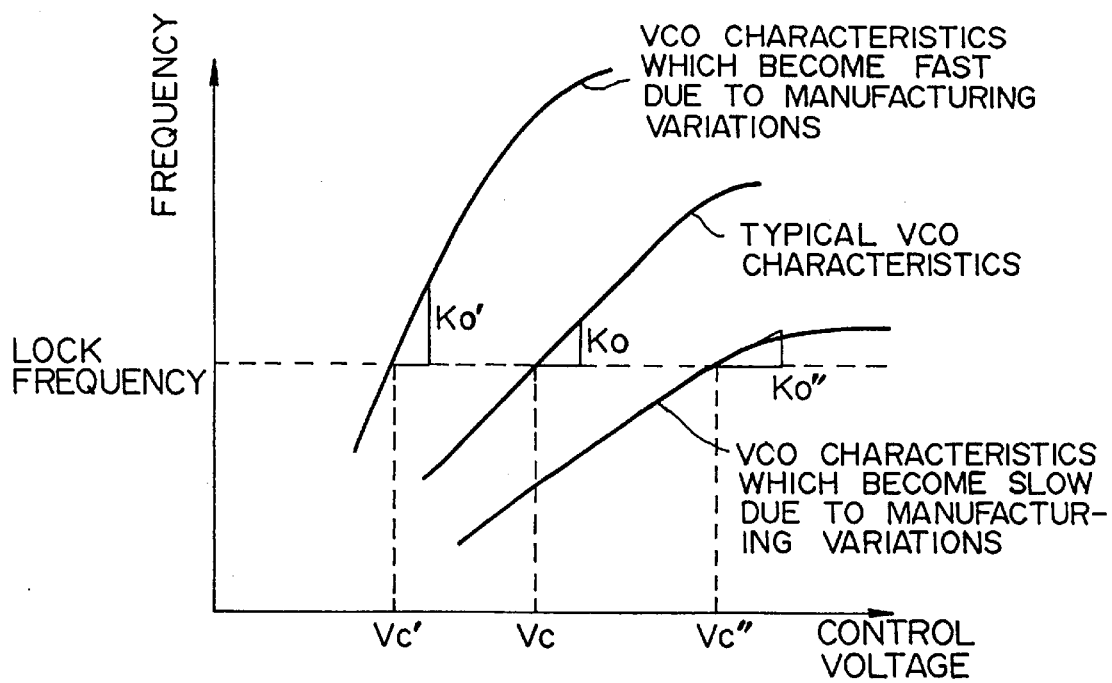
FIG. 3 is a characteristic view of a voltage control oscillator.

When the second PLL circuit 20 locks to a reference signal and the locked frequency thereof is constant, the control voltage of the voltage control oscillator 24 becomes a locked voltage which differs depending upon manufacturing variations of the voltage control oscillator 24, and variations in characteristics due to temperature and voltage. The state of the characteristic variations in the voltage control oscillator 24 is shown in FIG. 3. More specifically, as is clear from the characteristic view of FIG. 3, if the locked voltage (control voltage) of the voltage control oscillator 24 having typical characteristics is denoted as Vc, a locked voltage Vc' which leads due to manufacturing variations or the like is smaller than the control voltage Vc, and a locked voltage Vc" which lags is greater than the control voltage Vc.

There is a tendency for variations in the characteristics of the voltage control oscillator to be constant. If the sensitivity of the voltage control oscillator having typical characteristics is denoted as Ko, regarding the sensitivity in a locked frequency, the sensitivity Ko' of a voltage control oscillator which leads is higher than the sensitivity Ko, and the sensitivity Ko" of a voltage control oscillator which lags is lower than the sensitivity Ko. Therefore, there is a strong negative correlation between the control voltage Vc and the sensitivity of the voltage control oscillator. That is, the locked voltage of the voltage control oscillator 24 becomes a measure for estimating the sensitivity of the voltage control oscillator 14.

At this point, when the voltage control oscillator 14 and the voltage control oscillator 24 cause characteristic variations to occur due to the same factors, there is a strong positive correlation between the sensitivities of the two voltage control oscillators 14 and 24. Therefore, by controlling the output current Ip of the charge pump circuit 12 in response to the locked voltage of the voltage control oscillator 24, it is possible to cause the output current Ip to be almost inversely proportional to the sensitivity Ko of the voltage control oscillator 14. As described in the related art of this specification, it is easy to cause the output current Ip of the charge pump circuit 12 to be inversely proportional to the resistor R1 of the loop filter 13, and characteristics expressed by the following equation can be realized:

$$Ip \approx \frac{A}{KoR} \quad (A = \text{constant}) \qquad (4)$$

Here, substitution of equation (4) in equation (3) makes it possible to obtain the following equation, and it can be seen that the band becomes constant regardless of characteristic variations in the elements and circuits.

$$\omega(-3\ dB) \approx A/2\pi N = \text{constant} \qquad (5)$$

As described above, in the PLL circuit provided with the second PLL circuit 20 as what is commonly called a dummy, by assuming the control voltage Vc of the voltage control oscillator 24 of the second PLL circuit 20 to be a control input for the charge pump circuit 12 of the first PLL circuit 10 and controlling the output current Ip thereof, the output current Ip of the charge pump circuit 12 of the first PLL circuit 10 is controlled as a function of the control voltage Vc of the voltage control oscillator 24 of the second PLL circuit 20. As a result, since the gain of the first PLL circuit 10 can be controlled with the control voltage Vc of the voltage control oscillator 24 of the second PLL circuit 20, it is possible to correct variations of the loop band due to manufacturing variations of the sensitivity of the voltage control oscillator 14 of the first PLL circuit 10, and thus the response band of the first PLL circuit 10 can be stabilized.

Figure 4:
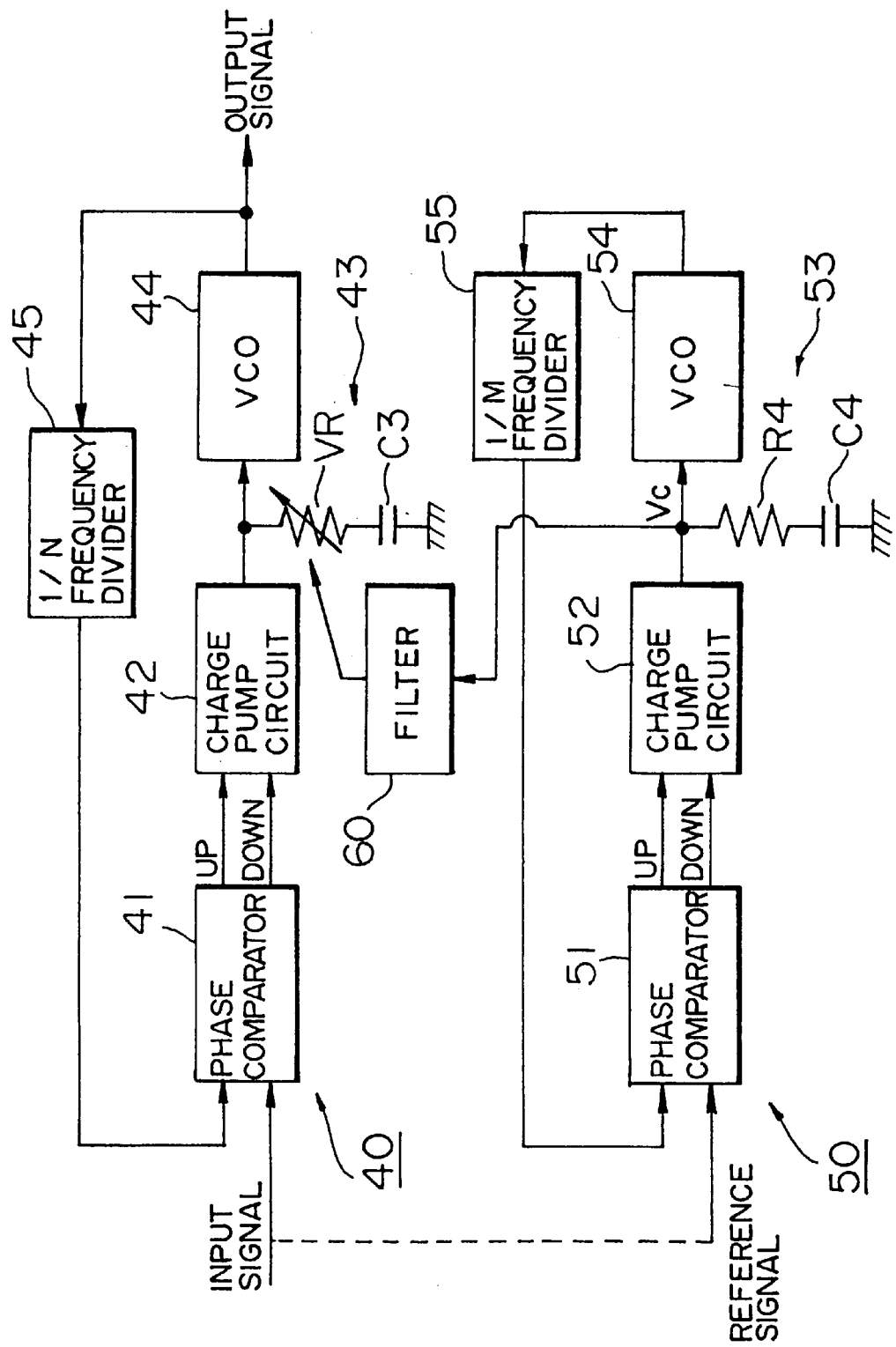
FIG. 4 is a block diagram illustrating a second embodiment of the present invention.

FIG. 4 is a block diagram illustrating a second embodiment of the present invention. In FIG. 4, a PLL circuit of this embodiment comprises a first PLL circuit 40 for generating a clock signal having a predetermined frequency in accordance with an input signal, and a second PLL circuit 50 which locks to a reference signal and which controls the gain of the first PLL circuit 40 by the locked voltage.

The first PLL circuit 40 comprises a phase comparator 41 which assumes an input signal supplied from an external source to be one input, a charge pump circuit 42 for outputting electric current Ip which is pulse-width-modulated with phase information (up/down) from the phase comparator 41, a loop filter 43, formed of a variable resistor VR and a capacitor C, which smooths the output current Ip of the charge pump circuit 42, a voltage control oscillator 44 which assumes the DC output voltage of the loop filter 43 to be a control voltage and which outputs a clock signal having a frequency N times as high as that of an input signal, and a frequency divider 45 which frequency-divides an oscillation frequency of the voltage control oscillator 44 by 1/N and which assumes this divided frequency to be the other input.

Similar to the first PLL circuit 40, the second PLL circuit 50 basically comprises a phase comparator 51 which assumes a reference signal to be one input, a charge pump circuit 52 which outputs electric current Ip of a magnitude which is time-modulated with phase information from the phase comparator 51, a loop filter 53, formed of a resistor R4 and a capacitor C4, which smooths the output current Ip of the charge pump circuit 52, a voltage control oscillator 54 which assumes a DC output voltage of the loop filter 53 to be a control voltage and outputs a clock signal having a frequency M times as high as that of the reference signal, and a frequency divider 55 which frequency-divides an oscillation frequency of the voltage control oscillator 54 by 1/M and which assumes this divided frequency to be the other input of the phase comparator 51. As the voltage control oscillator 54, a voltage control oscillator is used having characteristics substantially similar to those of the voltage control oscillator 44 within the first PLL circuit 40.

Further, the DC output voltage of the loop filter 53 of the second PLL circuit 50, i.e., the control voltage Vc of the voltage control oscillator 54, is supplied to the variable resistor VR of the first PLL circuit 40 via a filter 60 in order to control the resistance value of the variable resistor VR. The filter 60 is provided to remove ripple noise contained in the control voltage Vc of the voltage control oscillator 54. Therefore, if this ripple noise is of a degree as to be ignorable in terms of circuit operation, the filter 60 may be omitted, and the control voltage Vc of the voltage control oscillator 54 may be directly supplied to the variable resistor VR.

In the loop filter 43 of the first PLL circuit 40, as a variable resistor VR thereof, for example, a J-EFT (junction-type field-effect transistor) may be used. In the variable resistor VR using this J-EFT, by applying the control voltage Vc of the voltage control oscillator 54 to the gate of the J-EFT and controlling the expansion of the depletion layer according to the magnitude of the control voltage Vc, the drain current is controlled by widening or narrowing the width of the channel. As a result, equivalently, the resistance value of the variable resistor VR varies in response to the control voltage Vc of the voltage control oscillator 54.

In the PLL circuit of the second embodiment having the above-described construction, the control voltage Vc supplied from the loop filter 53 of the second PLL circuit 50, i.e., the locked voltage Vc of the voltage control oscillator 54, has a strong correlation with the sensitivity of the voltage control oscillator 55, and also has a strong correlation with the sensitivity Ko of the voltage control oscillator 44. Therefore, the resistance value R of the variable resistor VR of the loop filter 43 can be controlled as described in the following equation.

$$R \approx \frac{A}{KoIp} \quad (A = \text{constant}) \tag{6}$$

At this point, substitution of equation (6) in equation (3) makes it possible to obtain equation (5) in a similar manner to the first embodiment, and it can be seen that the band is stabilized.

As described above, by assuming the resistance of the loop filter 43 in the first PLL circuit 40 to be a variable resistor VR and controlling the resistance value of the variable resistor VR with the control voltage Vc of the voltage control oscillator 54 of the second PLL circuit 50, the gain of the first PLL circuit 40 can be controlled with the control voltage Vc of the voltage control oscillator 54 of the second PLL circuit 50. Therefore, it is possible to correct variations of the loop band due to manufacturing variations of the sensitivity of the voltage control oscillator 44 of the first PLL circuit 40, and thus the response band of the first PLL circuit 40 can be stabilized.

Figure 5:
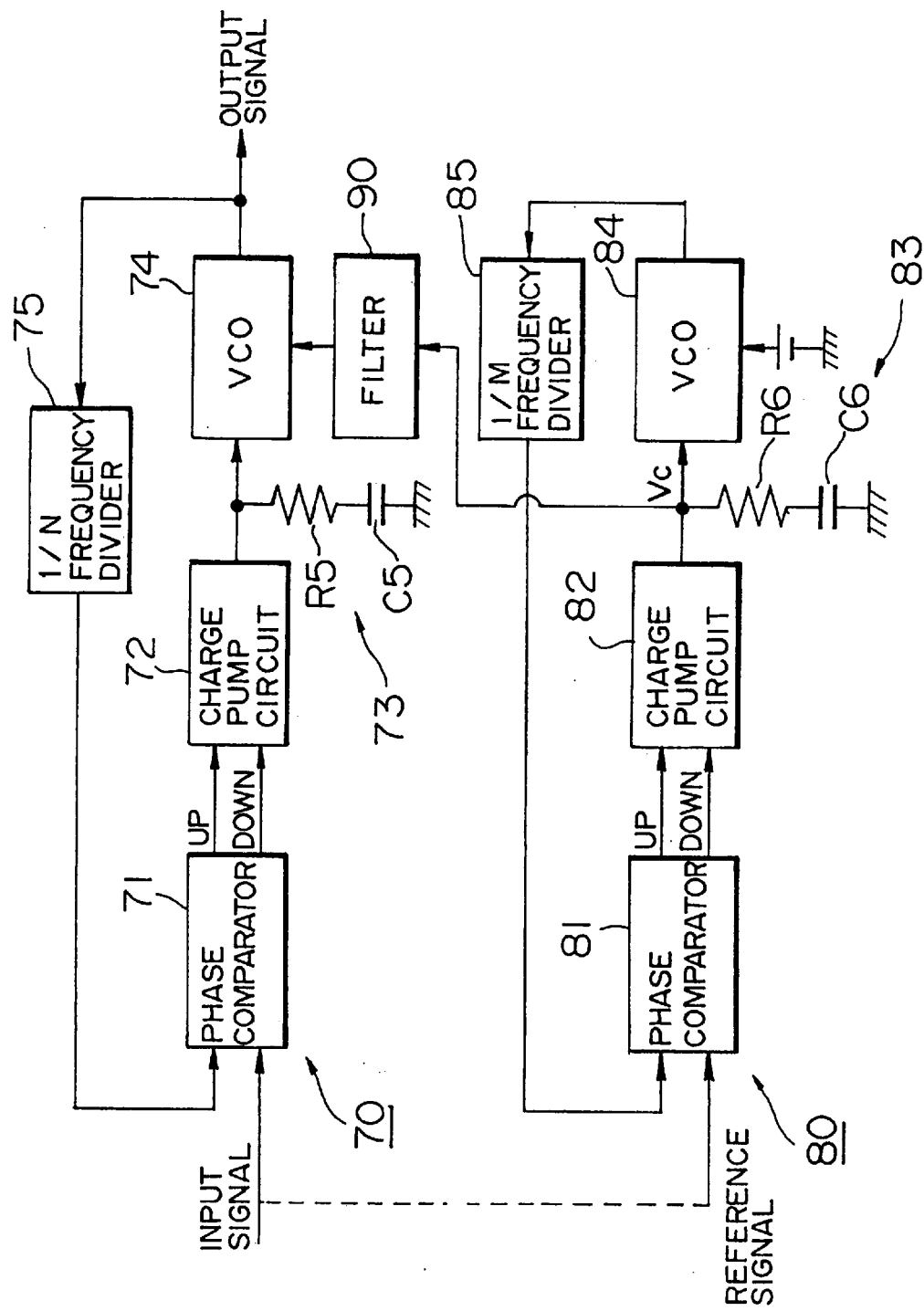
FIG. 5 is a block diagram illustrating a third embodiment of the present invention.
Figure 6:
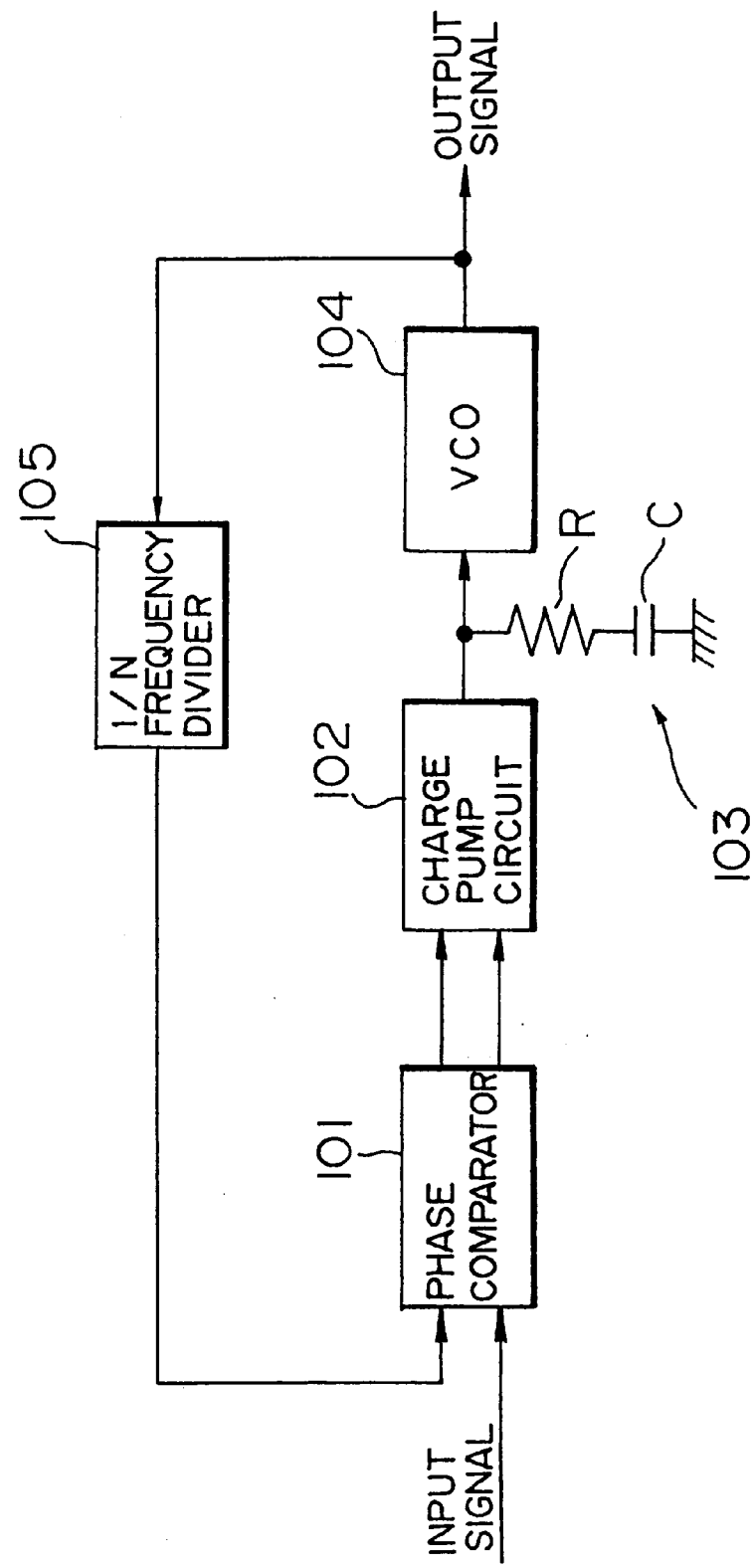
FIG. 6 is a block diagram illustrating a conventional example.

FIG. 5 is a block diagram illustrating a third embodiment of the present invention. In FIG. 5, a PLL circuit of this embodiment comprises a first PLL circuit 70 for generating a clock signal having a predetermined frequency in accordance with an input signal, and a second PLL circuit 80 which locks to a reference signal and which controls the gain of the first PLL circuit 70 by the locked voltage.

The first PLL circuit 70 comprises a phase comparator 71 which assumes an input signal supplied from an external source to be one input, a charge pump circuit 72 for outputting electric current Ip which is pulse-width-modulated with phase information (up/down) from the phase comparator 71, a loop filter 73, formed of a resistor R5 and a capacitor C5, which smooths the output current Ip of the charge pump circuit 72, a voltage control oscillator 74 which assumes the DC output voltage of the loop filter 73 to be a control voltage and which outputs a clock signal having a frequency N times as high as that of the input signal, and a frequency divider 75 which frequency-divides an oscillation frequency of the voltage control oscillator 74 by 1/N and which assumes this divided frequency to be the other input of the phase comparator 71. As the voltage control oscillator 74, a voltage control oscillator is used having characteristics substantially similar to those of the voltage control oscillator 74 within the first PLL circuit 70.

Similar to the first PLL circuit 70, a second PLL circuit 80 basically comprises a phase comparator 81 which assumes a reference signal to be one input, a charge pump circuit 82 which outputs electric current Ip of a magnitude which is time-modulated with phase information from the phase comparator 81, a loop filter 83, formed of a resistor R6 and a capacitor C6, which smooths the output current Ip of the charge pump circuit 82, a voltage control oscillator 84 which assumes a DC output voltage of the loop filter 83 to be a control voltage and outputs a clock signal having a frequency M times as high as that of the reference signal, and a frequency divider 85 which frequency-divides an oscillation frequency of the voltage control oscillator 84 by 1/M and which assumes this divided frequency to be the other input of the phase comparator 81. As the voltage control oscillator 84, a voltage control oscillator is used having characteristics substantially similar to those of the voltage control oscillator 84 within the first PLL circuit 80.

Further, the DC output voltage of the loop filter 83 of the second PLL circuit 80, i.e., the control voltage Vc of the voltage control oscillator 84, is supplied to the voltage control oscillator 74 via a filter 90 in order to control the sensitivity of the voltage control oscillator 74. The filter 90 is provided to remove ripple noise contained in the control voltage Vc of the voltage control oscillator 84. Therefore, if this ripple noise is of a degree as to be ignorable in terms of circuit operation, the filter 90 may be omitted, and the control voltage Vc of the voltage control oscillator 84 may be directly supplied to the voltage control oscillator 74 in order to control the voltage control oscillator 74.

In the PLL circuit of the third embodiment having the above-described construction, if the characteristics in a case where the sensitivity of the voltage control oscillator 74 of the first PLL circuit 70 is fixed, vary in the same way as the characteristics of the voltage control oscillator 84 of the second PLL circuit 80, the voltage control oscillators 74 and 84 slowly vary to low sensitivity when the lock voltage Vc of the voltage control oscillator 84 is large, and the voltage control oscillators 74 and 84 quickly vary to high sensitivity when the lock voltage Vc of the voltage control oscillator 84 is small. Therefore, it is possible to control the sensitivity of the voltage control oscillator 74 with the lock voltage Vc of the voltage control oscillator 84 in such a manner as to cancel the variation.

As described above, by forming the voltage control oscillator 74 in the first PLL circuit 70 in such a manner that the sensitivity thereof is variable and by controlling the sensitivity of the voltage control oscillator 74 on the basis of the control voltage Vc of the voltage control oscillator 84 of the second PLL circuit 80, it is possible to correct variations of the loop band due to manufacturing variations of the sensitivity of the voltage control oscillator 74 of the first PLL circuit 70 because the voltage control oscillator 74 whose sensitivity has been controlled is equivalent to a voltage control oscillator whose sensitivity does not vary, and thus the response band of the first PLL circuit 70 can be stabilized.

In each of the above-described embodiments, a circuit is formed in which 1/N frequency dividers 15, 45 and 75 are provided in a loop of the first PLL circuit 10, 40 and 70, respectively, and a circuit is formed in which 1/M frequency dividers 25, 55 and 85 are provided in a loop of the second PLL circuit 20, 50 and 80, respectively. However, these frequency dividers may be omitted, and a circuit which generates a clock signal having a frequency equal to each frequency of an input signal and a reference signal may be provided. Further, a PLL circuit may be provided such that an input signal or a reference signal is serial data and the clock of data is extracted.

Although each of the above-described embodiments describes a case in which the second PLL circuit 20, 50 and 80 are used only as dummies for controlling the gain of the first PLL circuits 10, 40 and 70, these may also be used as circuits for generating a clock signal having a frequency different from that of the first PLL circuits 10, 40 and 70 by guiding out the output of the voltage control oscillators 24, 55 and 85 to an external source.

Furthermore, in each of the above-described embodiments, as a reference signal for the second PLL circuits 20, 50 and 80, a signal is used which is different from the input signal of the first PLL circuit 10, 40 and 70. However, it is also possible to use the input signal of the first PLL circuits 10, 40 and 70 as it is. This makes it possible to omit a signal generation source exclusively used for generating a reference signal. However, if the respective frequency-division ratios of the 1/N frequency dividers 15, 45 and 75 within the first PLL circuit 10, 40 and 70 and 1/M frequency dividers 25, 55 and 85 within the second PLL circuit 20, 50 and 80 are set equal or if these frequency dividers are omitted, the second PLL circuits 20, 50 and 80 can be used only as dummies.

In comparison with this, even if the input signal of the first PLL circuits 10, 40 and 70 is used as it is as the reference signal of the second PLL circuits 20, 50 and 80, it becomes possible to use the second PLL circuits 20, 50 and 80 not only as dummies but also as circuits for generating a second clock signal by varying each frequency-division ratio of the 1/N frequency dividers 15, 45 and 75 within the first PLL circuit 10, 40 and 70 and 1/M frequency dividers 25, 55 and 85 within the second PLL circuit 20, 50 and 80.

In addition, it is also possible to insert a circuit having a frequency filter or a non-linear circuit, or a circuit having both of these functions, in place of the filters 30, 60 and 90 between each control input end of the charge pump circuits 12, 42 and 72 of the first PLL circuit 10, 40 and 70 and each output end of the loop filters 23, 53 and 83 of the second PLL circuit 20, 50 and 80. Here, the frequency filter has the function of removing signals of a specific frequency. The non-linear circuit has the function for bringing the lock voltages Vc of the voltage control oscillators 24, 54 and 84 of the second PLL circuits 20, 50 and 80, the output currents Ip of the first PLL circuits 10, 40 and 70, the resistance value R of the charge pump circuit 42 and the sensitivity Ko of the voltage control oscillator 74 into a more inversely proportional relation.

As has been described up to this point, according to the present invention, a dummy PLL circuit having a voltage control oscillator having characteristics substantially similar to those of a voltage control oscillator within an original PLL circuit, is provided with respect to the original PLL circuit which generates a clock signal having a predetermined frequency in accordance with an input signal, and the gain of the original PLL circuit is controlled on the basis of the locked voltage of the voltage control oscillator within the dummy PLL circuit. As a result, since variations of the loop band due to manufacturing variations of the sensitivity of the voltage control oscillator within the original PLL circuit can be corrected, the response band of the original PLL circuit can be stabilized.

As a result, even if manufacturing variations of the sensitivity of the voltage control oscillator are large, it is possible to manufacture a PLL circuit for use in precisely defining a band. Further, variations of the response band of the PLL circuit due to temperature, voltage or other conditions can be suppressed in the same manner as variations of the response band due to manufacturing variations of the sensitivity of the voltage control oscillator.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A PLL circuit, comprising:
   a first PLL circuit which generates a clock signal having a predetermined frequency in accordance with an input signal, said first PLL circuit including a first voltage control oscillator and a charge pump circuit;
   a second PLL circuit including a second voltage control oscillator having characteristics substantially similar to those of said first voltage control oscillator within said first PLL circuit and which operates in accordance with a reference signal; and
   control means which controls the gain of said first PLL circuit on the basis of a locked voltage of the second voltage control oscillator within said second PLL circuit wherein the input signal of said first PLL circuit is used as the reference signal of said second PLL circuit, wherein said control means controls the charge pump circuit within said first PLL circuit on the basis of a locked voltage of the second voltage control oscillator within said second PLL circuit.

2. The PLL circuit according to claim 1, further comprising a filter wherein said locked voltage of the second voltage control oscillator is input to said control means through said filter, wherein an output current of the charge pump circuit within said first PLL circuit is controlled.

3. A PLL circuit, comprising:
   a first PLL circuit which generates a clock signal having a predetermined frequency in accordance with an input signal, said first PLL circuit including a first voltage control oscillator and a loop filter;
   a second PLL circuit including a second voltage control oscillator having characteristics substantially similar to those of said first voltage control oscillator within said first PLL circuit and which operates in accordance with a reference signal; and
   control means which controls the gain of said first PLL circuit on the basis of a locked voltage of the second voltage control oscillator within said second PLL circuit wherein the input signal of said first PLL circuit is used as the reference signal of said second PLL circuit, wherein said control means controls the loop filter within said first PLL circuit on the basis of a locked voltage of the second voltage control oscillator within said second PLL circuit.

4. The PLL circuit according to claim 3, a further comprising a filter wherein said locked voltage of the second voltage control oscillator is input to said control means through said filter, wherein a value of a resistor which constitutes the loop filter within said first PLL circuit is controlled.

5. A PLL circuit, comprising:
   a first PLL circuit which generates a clock signal having a predetermined frequency in accordance with an input signal, said first PLL circuit including a first voltage control oscillator;
   a second PLL circuit including a second voltage control oscillator having characteristics substantially similar to those of said first voltage control oscillator within said first PLL circuit and which operates in accordance with a reference signal; and control means which controls the gain of said first PLL circuit on the basis of a locked voltage of the second voltage control oscillator within said second PLL circuit wherein the input signal of said first PLL circuit is used as the reference signal of said second PLL circuit, wherein said control means controls the sensitivity of the first voltage control oscillator within said first PLL circuit on the basis of a locked voltage of the second voltage control oscillator within said second PLL circuit.

6. The PLL circuit according to claim 5, further comprising a filter wherein said locked voltage of the second voltage control oscillator is input to said control means through said filter.

* * * * *

UNITED STATES PATENT AND TRADEMARK OFFICE
CERTIFICATE OF CORRECTION

PATENT NO. : 5,977,806
DATED : November 2, 1999
INVENTOR(S) : Hidekazu KIKUCHI

It is certified that error appears in the above-identified patent and that said Letters Patent is hereby corrected as shown below:

Column 10, Line 12 et seq., Claim 4 should read as follows;

The PLL circuit according to claim 3, further comprising a filter wherein said locked voltage of the second voltage control oscillator is input to said control means through said filter, wherein a value of a resistor which constitutes the loop filter within said first PLL circuit is controlled.

Signed and Sealed this

Twenty-fourth Day of October, 2000

Attest:

Q. TODD DICKINSON

*Attesting Officer*     *Director of Patents and Trademarks*